United States Patent
Ko et al.

(10) Patent No.: US 7,612,618 B2
(45) Date of Patent: Nov. 3, 2009

(54) PLL APPARATUS FOR OFDM SYSTEM HAVING VARIABLE CHANNEL BANDS AND OPERATING METHOD THEREOF

(75) Inventors: Yun-Soo Ko, Daejon (KR); Seong-Min Kim, Daejon (KR); Kwang-Chun Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 59 days.

(21) Appl. No.: 11/925,073

(22) Filed: Oct. 26, 2007

(65) Prior Publication Data

US 2008/0129391 A1  Jun. 5, 2008

(30) Foreign Application Priority Data

Dec. 4, 2006  (KR) ................ 10-2006-0121676
Feb. 9, 2007  (KR) ................ 10-2007-0013852

(51) Int. Cl.
*H03L 7/00* (2006.01)
(52) U.S. Cl. .............. 331/17; 331/15; 331/177 R; 331/182
(58) Field of Classification Search ........... 331/15, 331/17, 177 R, 182
See application file for complete search history.

(56) References Cited

U.S. PATENT DOCUMENTS 5,534,823 A  7/1996  Kondou 6,408,038 B1  6/2002  Takeuchi
6,476,681 B1  11/2002  Kirkpatrick
2007/0164829 A1 * 7/2007  Ko .............................. 331/17

FOREIGN PATENT DOCUMENTS

| JP | 07-086934 | 3/1995 |
| JP | 11-055115 | 2/1999 |
| KR | 1020010003432 | 1/2001 |
| KR | 1020010038734 | 5/2001 |
| KR | 1020060093759 | 8/2006 |
| KR | 1020060093929 | 8/2006 |

OTHER PUBLICATIONS

KIPO Notice of Patent Grant dated Mar. 17, 2008 for the corresponding application KR 10-2007-0013852.

* cited by examiner

*Primary Examiner*—Joseph Chang
*Assistant Examiner*—Jeffrey Shin
(74) *Attorney, Agent, or Firm*—Ladas & Parry LLP

(57) ABSTRACT

Provided are a PLL apparatus for an OFDM system having variable channel band and an operating method thereof. The PLL apparatus includes a frequency divider for dividing an oscillating signal; a phase detector for detecting a phase difference between a reference signal and the divided oscillating signal from the frequency divider and outputting the phase difference signal; a variable loop filter for filtering a phase difference signal outputted from the phase detector; a voltage control oscillator for outputting the oscillator signal to the frequency divider according to the voltage control signal filtered from the variable loop filter; and a variable loop filter controller for varying a filtering band of the variable loop filter according to each of the channel bands.

8 Claims, 3 Drawing Sheets

PLL APPARATUS FOR OFDM SYSTEM HAVING VARIABLE CHANNEL BANDS AND OPERATING METHOD THEREOF

CROSS-REFERENCES TO RELATED APPLICATIONS

The present invention claims priority of Korean Patent Application Nos. 10-2006-0121676 and 10-2007-0013852, filed on Dec. 4, 2006, and Feb. 9, 2007, respectively, which are incorporated herein by reference.

BACKGROUND OF THE INVENTION

1. Field of the Invention

The present invention relates to a phase locked loop (PLL) apparatus for an orthogonal frequency division multiplexing (OFDM) system having variable channel band and an operating method thereof; and, more particularly, to a PLL apparatus for an OFDM system having variable channel band and an operating method thereof for improving a radio frequency (RF) performance of the OFDM system by enabling a PLL module to have different phase noise characteristics for each of channel bands by changing a loop filter of the PLL module, thereby sustaining orthogonality between subcarriers.

This work was supported by the Information Technology (IT) research and development program of the Korean Ministry of Information and Communication (MIC) and the Korean Institute for Information Technology Advancement (IITA) [2005-S-016-02, "Development of Multimode Base Station"].

2. Description of Related Art

An orthogonal frequency division multiplexing (OFDM) system uses the orthogonality between subcarriers. Therefore, if the orthogonality between subcarriers reduces, the system performance thereof is also deteriorated. That is, the frequency offset and the phase noise of a phase locked loop (PLL) module having an oscillator are main factors to deteriorate the system performance in a view of a radio frequency (RF).

It is impossible to compensate the phase noise once the phase noise is generated although the frequency offset can be compensated by automatically controlling a frequency of a system. Therefore, the phase noise between subcarriers is more important in the OFDM system.

Hereinafter, a phase locked loop (PLL) apparatus of an orthogonal frequency division multiplexing (OFDM) system using a fixed channel band according to the related art will be described with reference to FIGS. 1 to 3.

As shown in FIG. 1, the OFDM system according to the related art has a fixed subcarrier gap because the OFDM system according to the related art uses one fixed channel band. Therefore, the system performance deterioration is prevented by minimizing the phase noise of a PLL module in a subcarrier offset as shown in FIG. 2.

However, the subcarrier gap is variable if the OFDM system according to the related art uses a variable channel band. Therefore, if the OFDM system according to the related art uses a PLL module having constant phase noise characteristics regardless of a channel band as shown in FIG. 1, the orthogonality between subcarriers becomes deteriorated because the phase noise of the PLL module operates as a noise in adjacent subcarrier, thereby deteriorating the system OFDM performance.

SUMMARY OF THE INVENTION

An embodiment of the present invention is directed to providing a PLL apparatus for OFDM system having variable channel band and an operating method thereof for improving a radio frequency (RF) performance of the OFDM system by enabling a PLL module to have different phase noise characteristics for each of channel bands by changing a loop filter of the PLL module, thereby sustaining orthogonality between subcarriers.

In accordance with an aspect of the present invention, there is provided a phase locked loop (PLL) apparatus for an orthogonal frequency division multiplexing (OFDM) system having variable channel band, including: a frequency divider for dividing an oscillating signal; a phase detector for detecting a phase difference between a reference signal and the divided oscillating signal from the frequency divider and outputting the phase difference signal; a variable loop filter for filtering a phase difference signal outputted from the phase detector; a voltage control oscillator for outputting the oscillator signal to the frequency divider according to the voltage control signal filtered from the variable loop filter; and a variable loop filter controller for varying a filtering band of the variable loop filter according to each of the channel bands.

In accordance with another aspect of the present invention, there is provided a method for operating a phase locked loop (PLL) of an orthogonal frequency division multiplexing (OFDM) system having variable channel bands, including the steps of: a) dividing an oscillating signal; b) outputting a phase difference signal by detecting a phase difference between the divided oscillating signal and a reference signal; c) filtering the outputted phase difference signal; and d) outputting an oscillating signal according to the filtered voltage control signal, wherein in the step c), the phase difference signal is filtered with a filtering band changed according to a control signal corresponding to each of channel bands.

Also, the PLL apparatus and the operating method thereof according to an embodiment of the present invention improve the system performance by minimizing a phase noise of a PLL module in an adjacent subcarrier.

The PLL apparatus and the operating method thereof according to an embodiment of the present invention improve the system performance by embodying a PLL module to have different phase noise characteristics for each of channel bands by changing a loop filter of the PLL module instead of using a PLL module having a fixed phase characteristic for each of channel bands, thereby sustaining the orthogonality between subcarriers.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter.

Figure 1:
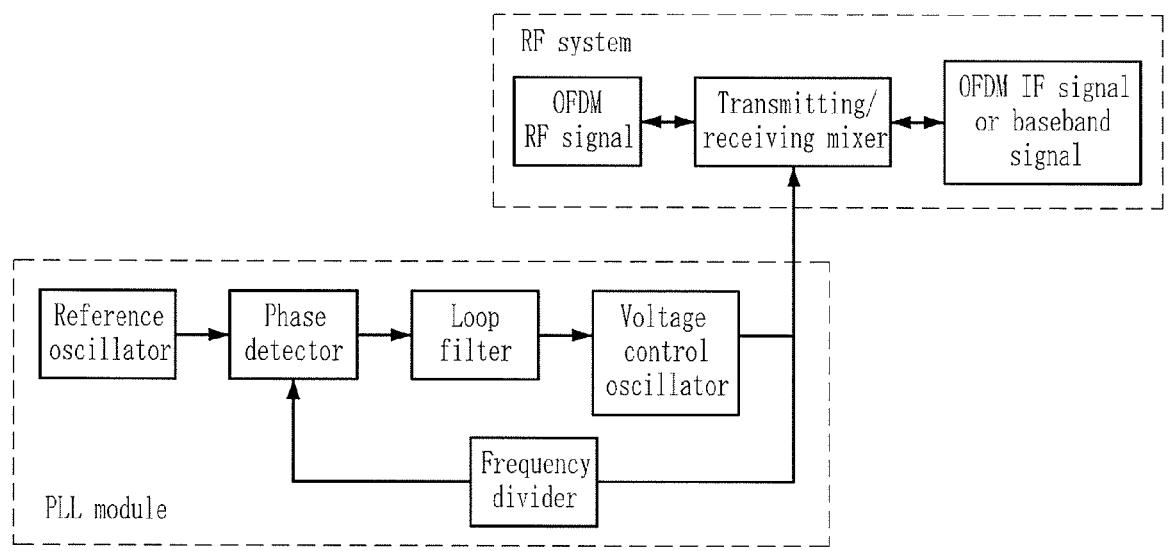
FIG. 1 is a block diagram illustrating a phase locked loop apparatus for an OFDM system having fixed channel band according to a related art.
Figure 2:
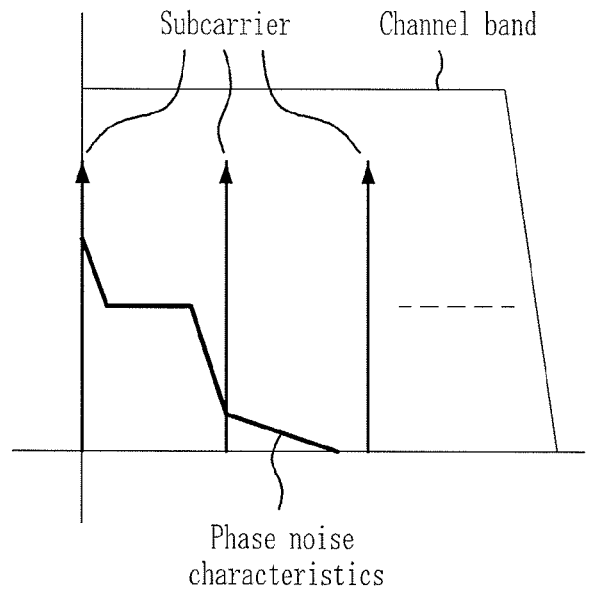
FIGS. 2 and 3 are diagrams showing the phase noise characteristics of a PLL apparatus of an OFDM system having a fixed channel band in according to a related art.
Figure 3:
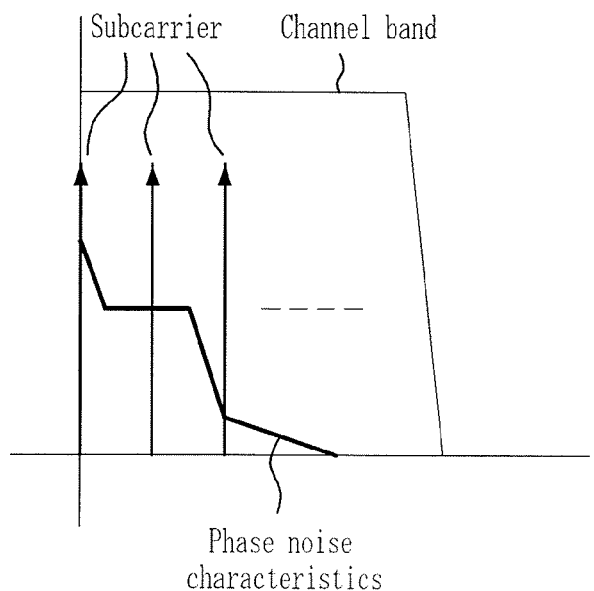
Figure 4:
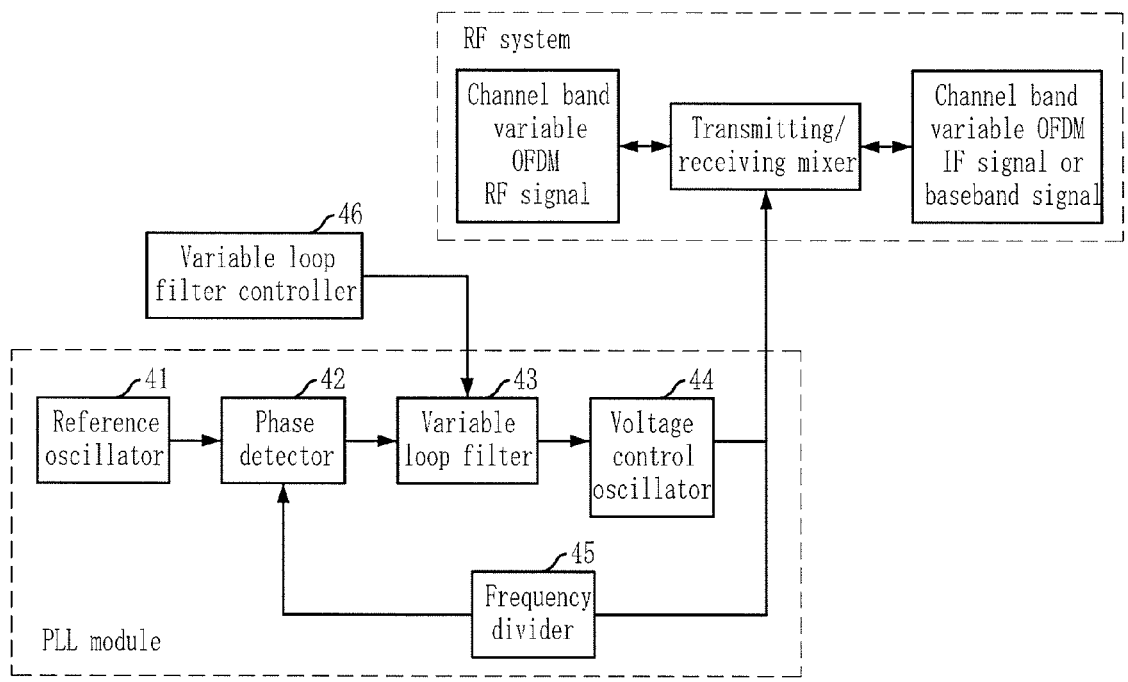
FIG. 4 is a block diagram illustrating a block diagram illustrating a phase locked loop (PLL) apparatus of an OFDM system having variable channel bands in accordance with an embodiment of the present invention.

FIG. 4 is a block diagram illustrating a phase locked loop (PLL) apparatus of an OFDM system having a variable channel bands in accordance with an embodiment of the present invention.

As shown in FIG. 4, the PLL apparatus according to the present embodiment uplink-converts an intermediate frequency (IF) signal or a baseband signal to a radio frequency (RF) signal, or downlink-converts a RF signal to an IF signal or a base band signal.

If a channel band changes in an OFDM system using a variable channel band, a gap between subcarriers changes too. Accordingly, if a phase noise of a PLL module in adjacent subcarrier is minimized by changing a band of a variable loop filter, the orthogonality between subcarriers can be sustained and the system performance can be improved.

In more detail, the PLL apparatus according to the present embodiment includes a reference oscillator 41, a phase detector 42, a variable loop filter 43, a voltage control oscillator 44, a frequency divider 45, and a variable loop filter controller 46. The reference oscillator 41 generates a reference signal. The phase detector 42 outputs a phase difference signal by detecting a phase difference between the generated reference signal and a divided oscillating signal from the frequency divider 45. The variable loop filter 43 filters the phase difference signal outputted from the phase detector 42. The voltage control oscillator 44 outputs the oscillator signal according to the filtered voltage control signal from the variable loop filter 43. The frequency divider 45 divides the oscillating signal of the voltage control oscillator 44. The variable loop filter controller 46 changes the filtering band of the variable loop filter 43 according to a channel band.

The variable loop filter controller 46 directly receives a supplementary control signal from a baseband or commonly uses a signal controlling a channel band of a RF in a baseband in order to change the filtering band of the variable loop filter 43.

Basically, the channel band is selected in a baseband in a system having variable channel band. Also, information about the selected channel band is transferred to a RF system and is used to control a channel band of a RF.

In a real system, the predetermined numbers of channels are selected from variable channel bands according to a predetermined standard, and a subcarrier gap is also selected according to the selected channels.

Therefore, variable channel bands for the variable loop filter 43 are selected at first. Then, the variable loop filter 43 receives a control signal according to a selected channel band from a baseband, and the variable loop filter 43 selects one of the variable channel bands according to the received control signal as a band of a variable filter.

As one of embodiments, a variable loop filter 43 may be embodied by including a plurality of filters for each of selected channel bands and a switch disposed at an input/output end of each filter. The variable loop filter 43 selects one of the filters by operating the switch according to a control signal.

That is, channel bands are set as 1.75 MHz, 3.5 MHz, 7 MHz, 3 MHz, 5.5 MHz, and 10 MHz, and subcarrier gaps for each channel band are set as 7.8125 kHz, 15.625 kHz, 31.25 kHz, 13.375 kHz, 24.6875 kHz, and 45 kHz in a wireless MAN-OFDM physical layer of IEEE p802.16-REVd/D5-2004.

Under such setting, the variable loop filter 43 includes filters each having a cut-off frequency at the subcarrier gap.

As another embodiment, a variable loop filter 43 may be embodied in a form of a LC filter having an inductor and a capacitor by applying a varactor diode in the capacitor C. In this case, the variable loop filter 43 change a filtering band by changing a voltage applied to the varactor diode.

That is, since the varactor diode is a part having capacity varying according to reverse voltage, the capacitor (C) value is reduced if a reverse voltage increases. Therefore, the variable loop filter 43 according to another embodiment can be embodied by applying the varactor diode in a LC or a RC filter. The variable loop filter 43 reduces a cut-off frequency thereof by increasing a control voltage because the C value becomes decreased. Also, the variable loop filter 43 increases the cut-off frequency thereof by decreasing a control voltage because the C value becomes increased.

As still another embodiment, a variable loop filter 43 may be embodied using an operational transconductance amplifier (OTA), which changes a filtering band by controlling a 'transconductance' applied current.

The OTA is an amplifier that amplifies an output current as much as 'transconductance' if a predetermined current flows through an input end. Therefore, the variable loop filter 43 according to the still another embodiment may be embodied by applying the OTA in a LC or a RC filter. The variable loop filter 43 according to the still another embodiment changes the locations of a pole and a zero (0) by controlling an OTA bias current because transconductance changes in proportion to the controlled OTA bias current.

Figure 5:
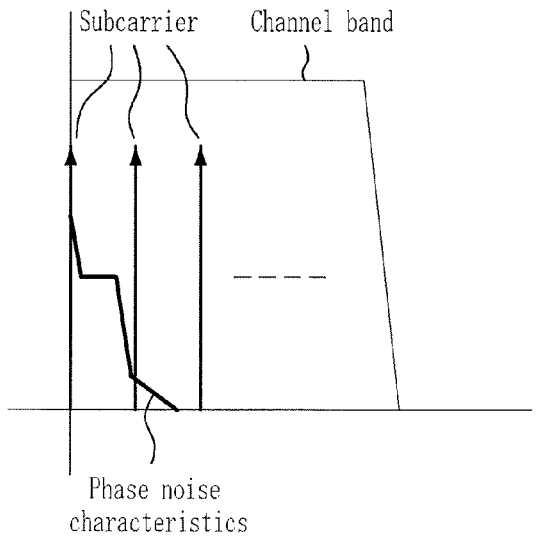
FIG. 5 is a graph showing phase noise characteristics of a PLL apparatus of an OFDM system having variable channel bands in accordance with an embodiment of the present invention.

As shown in FIG. 5, the PLL apparatus according to the present embodiment sustains the orthogonality between subcarriers although a channel band changes, thereby improving the system OFDM performance.

As described above, the PLL apparatus for OFDM system having variable channel band and an operating method thereof according to an embodiment of the present invention improves a radio frequency (RF) performance of the OFDM system by enabling a PLL module to have different phase noise characteristics for each of channel bands by changing a loop filter of the PLL module, thereby sustaining orthogonality between subcarriers.

The above described method according to the present invention can be embodied as a program and stored on a computer readable recording medium. The computer readable recording medium is any data storage device that can store data which can be thereafter read by the computer system. The computer readable recording medium includes a read-only memory (ROM), a random-access memory (RAM), a CD-ROM, a floppy disk, a hard disk and an optical magnetic disk.

While the present invention has been described with respect to certain preferred embodiments, it will be apparent to those skilled in the art that various changes and modifications may be made without departing from the spirits and scope of the invention as defined in the following claims.

What is claimed is:

1. A phase locked loop (PLL) apparatus of an orthogonal frequency division multiplexing (OFDM) system, comprising:
   a frequency dividing means for dividing an oscillating signal;
   a phase detecting means for detecting a phase difference between a reference signal and the divided signal from the frequency division means and outputting a phase difference signal;
   a variable loop filter for filtering the phase difference signal outputted from the phase detecting means;
   a voltage controlled oscillating means for outputting the oscillator signal to the frequency dividing means according to the voltage control signal filtered from the variable loop filter; and
   a variable loop filter control means for varying a filtering band of the variable loop filter for each of the plurality of channel bands having a plurality of subcarrier channels with subcarrier bandgaps between each of the plurality of subcarrier channels,
   wherein each of the subcarrier bandgaps change for each of the plurality channel bands, and
   wherein each of the plurality of subcarrier channels sustain orthogonality between each of the plurality of subcarrier channels when each of the plurality of channel bands change from a first channel band to a second channel band.

2. The PLL apparatus of claim 1, wherein the variable loop filter includes:
   a plurality of filters each having a filtering band corresponding to each of the channel bands; and
   a switch for connecting the phase detecting means and one of the filters,
   wherein the switch operates according to a control signal of the variable loop filter control means.

3. The PLL apparatus of claim 1, wherein the variable loop filter control means changes a filtering band by changing a voltage applied to the variable loop filter according to each of the channel bands.

4. The PLL apparatus of claim 1, wherein the variable loop filter control means changes a filtering band by changing a current applied to the variable loop filter according to each of the channel bands.

5. A method for operating a phase locked loop (PLL) of an orthogonal frequency division multiplexing (OFDM) system having variable channel bands, comprising the steps of:
   a) dividing an oscillating signal;
   b) outputting a phase difference signal by detecting a phase difference between the divided oscillating signal and a reference signal;
   c) filtering the outputted phase difference signal; and
   d) outputting an oscillating signal according to the filtered voltage control signal,
   wherein in the step c), the phase difference signal is filtered with a filtering band changed according to a control signal corresponding to each of plurality of channel bands having a plurality of subcarrier channels with subcarrier bandgaps between each of the plurality of subcarrier channels,
   wherein each of the subcarrier bandgaps change for each of the plurality channel bands, and
   wherein each of the plurality of subcarrier channels are configured to sustain orthogonality between each of the plurality of subcarrier channels when each of the plurality of channel bands change from a first channel band to a second channel band.

6. The method of claim 5, wherein in the step c), the phase difference signal is filtered by connecting the phase detecting means to one of the filters according to a control signal corresponding to each of the channel bands.

7. The method of claim 5, wherein in the step c), the phase difference signal is filtered by changing a filtering band according to a voltage corresponding to each of the channel bands.

8. The method of claim 5, wherein in the step c), the phase difference signal is filtered by changing a filtering band according to a current corresponding to each of the channel bands.

* * * * *